(12) United States Patent
Verbaas et al.

(10) Patent No.: US 11,225,716 B2
(45) Date of Patent: Jan. 18, 2022

(54) INTERNALLY COOLED MULTI-HOLE INJECTORS FOR DELIVERY OF PROCESS CHEMICALS

(71) Applicant: Tokyo Electron Limited, Tokyo (JP)

(72) Inventors: Melvin Verbaas, Yamanashi (JP); Anthony Dip, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 49 days.

(21) Appl. No.: 16/697,516

(22) Filed: Nov. 27, 2019

(65) Prior Publication Data

US 2021/0156029 A1 May 27, 2021

(51) Int. Cl.
*C23C 16/455* (2006.01)
*C23C 16/46* (2006.01)
*C23C 16/458* (2006.01)

(52) U.S. Cl.
CPC .... *C23C 16/45572* (2013.01); *C23C 16/4586* (2013.01); *C23C 16/45593* (2013.01); *C23C 16/46* (2013.01)

(58) Field of Classification Search
CPC ........ C23C 16/45572; C23C 16/45593; C23C 16/4586
See application file for complete search history.

(56) References Cited

U.S. PATENT DOCUMENTS

| 6,812,157 B1 * | 11/2004 | Gadgil | C23C 16/45551 117/200 |
| 6,845,732 B2 * | 1/2005 | Lim | C23C 16/452 118/715 |

(Continued)

FOREIGN PATENT DOCUMENTS

| CN | 102154628 A | * 8/2011 | ........ C23C 16/455 |
| KR | 20050108705 A | 11/2005 | |
| WO | 0018491 A1 | 4/2000 | |

OTHER PUBLICATIONS

Weyburne, David W., et al., "Design and operating considerations for a water-cooled close-spaced reactant injector in a production scale MOCVD reactor". Journal of Crystal Growth 170 (1997) 77-82.*

(Continued)

*Primary Examiner* — Bret P Chen

(74) *Attorney, Agent, or Firm* — Weihrouch IP

(57) ABSTRACT

Internally cooled multi-hole injectors to deliver process chemicals are provided. An internal channel in an injector for the delivery system delivers process chemicals, such as a gas precursor, to a reaction space or substrate within a process chamber through multiple holes formed by outlets. A cooling delivery path and a cooling return path for cooling chemicals are positioned adjacent the supply channel to cool the process chemicals internally within the injector. The cooling process can be controlled to achieve a target cooling level for the process chemicals within the channel. In operation, undesired deposits are reduced thereby extending the time between product maintenance cycles. Further, the delivery and return flow of the cooling chemicals helps to stimulate a more evenly distributed temperature for the supply channel. Still further, the disclosed embodiments can be used in high-temperature environments, such as above about 400 degrees Celsius.

17 Claims, 4 Drawing Sheets

(56) References Cited

U.S. PATENT DOCUMENTS

| | | | |
|---|---|---|---|
| 8,409,353 B2 | 4/2013 | Yokota et al. | |
| 9,587,312 B2* | 3/2017 | Silva | C23C 16/45572 |
| 2003/0049372 A1* | 3/2003 | Cook | H01L 21/67017 |
| | | | 427/248.1 |
| 2006/0021574 A1* | 2/2006 | Armour | C23C 16/45565 |
| | | | 118/715 |
| 2006/0062900 A1* | 3/2006 | Selvamanickam | |
| | | | H01L 39/2441 |
| | | | 427/62 |
| 2008/0064227 A1* | 3/2008 | Kim | C23C 16/4407 |
| | | | 438/787 |
| 2008/0236495 A1* | 10/2008 | Tompa | C23C 16/45572 |
| | | | 118/724 |
| 2010/0236483 A1* | 9/2010 | Liu | C23C 16/45589 |
| | | | 118/730 |
| 2015/0211113 A1* | 7/2015 | Nakajima | C23C 16/45572 |
| | | | 427/248.1 |
| 2017/0207078 A1 | 7/2017 | Chou et al. | |
| 2018/0163297 A1* | 6/2018 | Humfeld | C23C 16/402 |
| 2019/0316258 A1* | 10/2019 | Mitrovic | C23C 16/45572 |

OTHER PUBLICATIONS

Xu, Hongming, et al., "Fuel injector deposits in direct-injection spark-ignition engines". Progress in Energy and Combustion Science, Oct. 2015, pp. 1-68.*

Perez, Edgar Serrano, et al., "Sequential microcontroller-based control for a chemical vapor deposition process". Journal of Applied Research and Technology, 15 (2017) 593-598.*

Kurtz, S.R., et al., "Chemical vapor deposition of titanium nitride at low temperatures". Thin Solid Films, vol. 140, Issue 2, Jul. 1, 1986, pp. 277-290. Abstract Only.*

Vervaele, Mattias, et al., "Development of a new direct liquid injection system for nanoparticle deposition by chemical vapor deposition using nanoparticle solutions". Rev. Sci. Instrum. 87, 025101 (2016) pp. 1-7.*

Michau, Alexandre, et al., "Chromium Carbide Growth by Direct Liquid Injection Chemical Vapor Deposition in Long and Narrow Tubes, Experiments, Modeling and Simulation". Coatings, 2018, 8, 220, pp. 1-19.*

Ogawa, D., et al., "The direct injection of liquid droplets into low pressure plasmas". J. Vac. Sci. Technol. A 27, 342-351 (2009).*

* cited by examiner

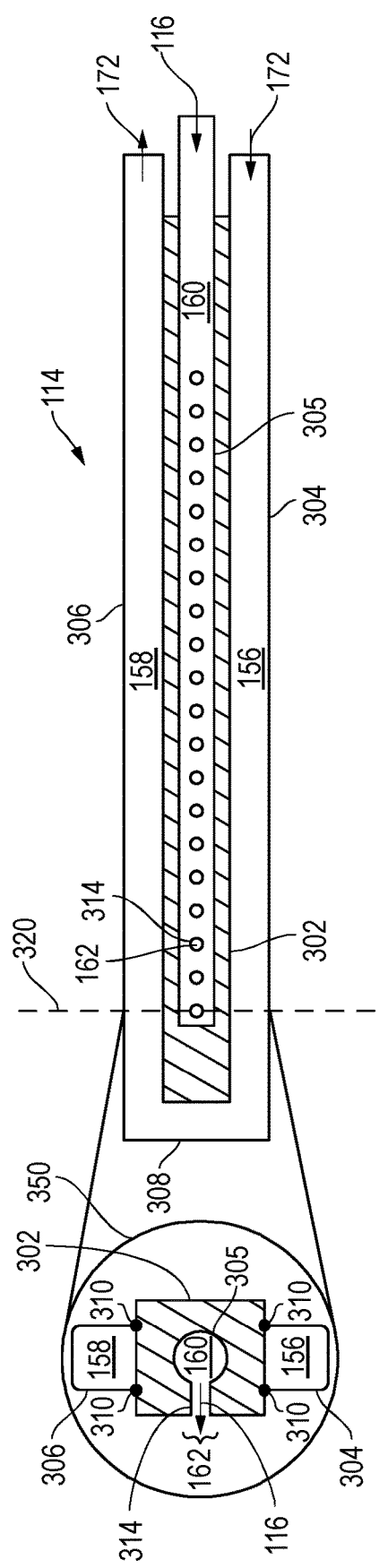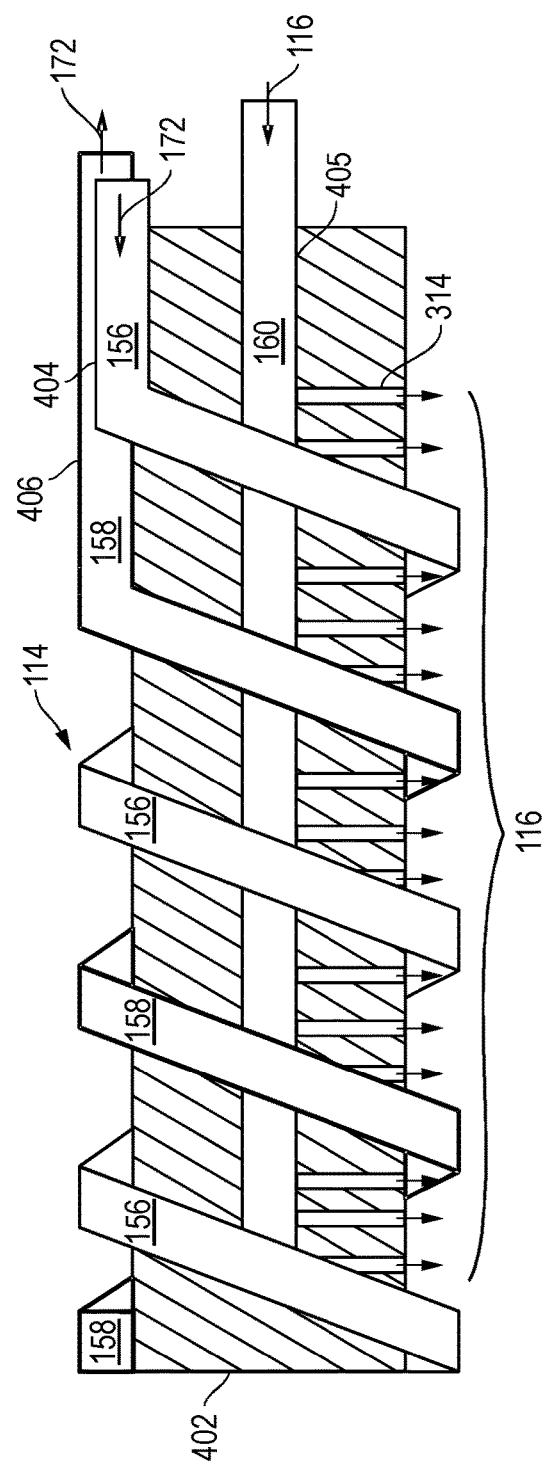

INTERNALLY COOLED MULTI-HOLE INJECTORS FOR DELIVERY OF PROCESS CHEMICALS

BACKGROUND

The present disclosure relates to methods for the manufacture of microelectronic workpieces including the formation of patterned structures on microelectronic workpieces.

For certain processes in the manufacture of microelectronic workpieces, it is desirable to deliver process chemicals to a substrate using a delivery system including an injector. For example, ozone ($O_3$) can be delivered to a substrate, such as a semiconductor wafer, to provide chemical vapor deposition (CVD) of silicon dioxide ($SiO_2$) on the substrate. Other oxidation or material layers can also be formed or deposited on a substrate for a microelectronic workpiece within a process chamber using such a delivery system.

Some process chemicals, such as precursors, suffer from reduction to less reactive precursors at elevated temperature. For example, ozone ($O_3$) depletes to oxygen ($O_2$) very rapidly at temperatures above about 300 degrees Celsius (° C.). Inside an injector for a delivery system, this rapid depletion can lead to non-uniform concentrations in outflow patterns delivered by the delivery system to a substrate for a microelectronic workpiece within a process chamber. Further, other precursors (e.g., silane) will self-deposit on the inside of injectors or will form deposits when mixed with other chemicals. For example, deposits will typically form inside injectors when dichlorosilane (DCS) is mixed with ammonia ($NH_3$). Growth rates for deposits inside injectors are typically much larger than on the target substrate (e.g., semiconductor wafer) within the process chamber due elevated pressure (e.g., one or more orders of magnitude) that typically exists inside the injectors as compared to the process chamber. Pressures are typically elevated to achieve uniform outflow from the injectors. The formation of deposits often cause the injectors to be the first source of contaminant particles entering the process chamber and can also cause injector clogging or breakage requiring more frequency process maintenance (PM) cycles.

Prior delivery systems have attempted to overcome these problems by water cooling injectors for delivery system. These prior water-cooled delivery systems, however, have still suffered from inconsistent delivery of process chemicals and have required frequent process maintenance (PM) due to clogging and other issues.

SUMMARY

Embodiments are described herein for internally cooled multi-hole injectors to deliver process chemicals for the processing of microelectronic workpieces. For disclosed embodiments, an internal channel in an injector is connected to a supply to deliver process chemicals, such as a gas precursor, to a reaction space or substrate within a process chamber. A cooling delivery path and a cooling return path for cooling chemicals are also positioned adjacent this supply channel to cool the process chemicals internally within the injector. Different or additional features, variations, and embodiments can also be implemented, and related systems and methods can be utilized as well.

For one embodiment, an injector to deliver process chemicals is disclosed including a channel for process chemicals, a plurality of outlets associated with the channel to deliver the process chemicals to a process chamber, a delivery path for cooling chemicals, and a return path for the cooling chemicals, where the delivery path and the return path are positioned with respect to the channel to cool the process chemicals internally within the injector. In further embodiments, the process chemicals include one or more gasses, and the cooling chemicals comprise one or more inert gasses.

In additional embodiments, the channel is formed within an inner tube surrounded by an outer tube, and wherein the delivery path and the return path are formed within the outer tube.

In additional embodiments, the channel, the delivery path, and the return path are formed within an injector body. In further embodiments, the delivery path includes one or more first tubes; the return path includes one or more second tubes; and the first tubes are connected to the second tubes. In still further embodiments, the injector includes one or more holes and one or more plugs sealing the holes, and the holes are formed during manufacture of the injector.

In additional embodiments, the channel is formed within an injector body, and the delivery path and the return path are formed by tubes coupled to the injector body. In further embodiments, the tubes for the delivery path and the return path are welded to the injector body or coiled around the injector body. In still further embodiments, the injector body is at least one of a cylindrical shape or a box shape.

For one embodiments, a processing system is disclosed including a process chamber, a delivery system to deliver process chemicals to a process chamber, and an injector within the delivery system. The injector includes a channel for the process chemicals, a plurality of outlets associated with the channel to deliver the process chemicals to the process chamber, a delivery path for cooling chemicals, and a return path for the cooling chemicals, where the delivery path and the return path are positioned with respect to the channel to cool the process chemicals internally within the injector. In further embodiments, the process chemicals include one or more gasses, and the cooling chemicals include one or more inert gasses.

In additional embodiments, the injector includes one or more reflective materials to limit radiant heat transfer. In further embodiments, the processing system includes a radiant heater associated with the substrate holder. In further embodiments, the reflective material has a thermal emissivity of less than or equal to 0.5.

In additional embodiments, the channel is formed within an inner tube surrounded by an outer tube, and the delivery path and the return path are formed within the outer tube. In other additional embodiments, the channel, the delivery path, and the return path are formed within an injector body. In other additional embodiments, the channel is formed within an injector body, and the delivery path and the return path are formed by tubes coupled to the injector body.

For one embodiment, a method to deliver process chemicals is disclosed including supplying process chemicals to a channel within an injector for a delivery system, cooling the channel internally within the injector using cooling chemicals passed through a delivery path for the cooling chemicals and a return path for the cooling chemicals, and delivering the cooled process chemicals to a process chamber using a plurality of outlets associated with the channel.

In additional embodiments, the method also includes controlling the cooling to achieve a target cooling level for the process chemicals. In other additional embodiments, the delivering is performed within a process chamber having a temperature of 400 degrees Celsius or more.

Different or additional features, variations, and embodiments can also be implemented, and related systems and methods can be utilized as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIG. 3 provides view of an example embodiment for an internally cooled multi-hole injector including cooling tubes for cooling chemicals that are coupled adjacent to an injector body having a channel for process chemicals.

FIG. 4 provides view of an example embodiment for an internally cooled multi-hole injector including cooling tubes for cooling chemicals that are coiled around an injector body having a channel for process chemicals.

DETAILED DESCRIPTION

Embodiments are described herein for internally cooled multi-hole injectors to deliver process chemicals for the processing of microelectronic workpieces. For disclosed embodiments, an internal channel in an injector is connected to a supply to deliver process chemicals, such as a gas precursor, to a reaction space or substrate within a process chamber. A cooling delivery path and a cooling return path for cooling chemicals are also positioned adjacent this supply channel to cool the process chemicals internally within the injector. As such, a target cooling level for the process chemicals within the channel can be achieved. A variety of advantages and implementations can be achieved while taking advantage of the techniques described herein.

The disclosed embodiments in part allow increased precursor concentrations to be used in the delivery of the process chemicals. Further, the disclosed embodiments reduce clogging and undesired deposits within the supply channel for the internally cooled injectors. As such, the time between process maintenance (PM) cycles is extended for processing systems using the disclosed delivery systems and internally cooled multi-hole injectors. For example, processing systems, such as CVD batch furnaces, that use the disclosed embodiments will have fewer PM cycles within a given period of operation thereby reducing cost-per-wafer (CPW) for these processing systems. Other advantages can also be achieved.

Figure 1A:
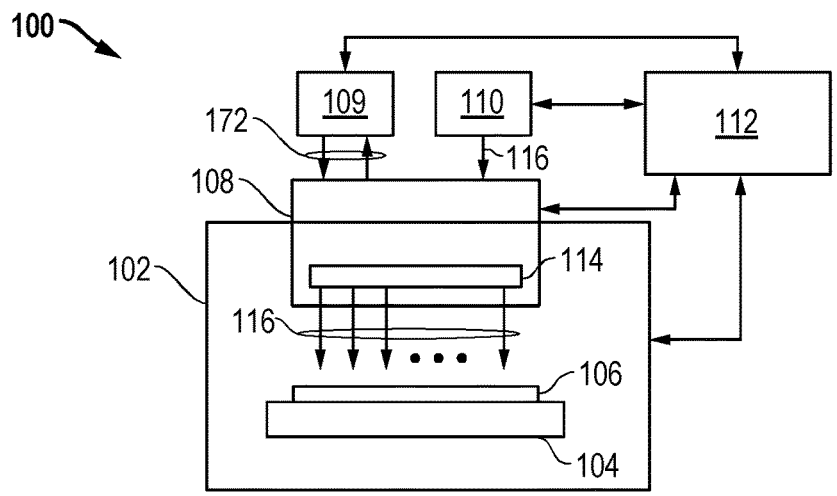
FIG. 1A is an example embodiment of a processing system for a microelectronic workpiece that can use one or more of the internally cooled multi-hole injector embodiments described herein.

FIG. 1A is an example embodiment of a processing system 100 for a microelectronic workpiece that can use one or more of the internally cooled multi-hole injector embodiments described herein. The processing system 100 includes a controller 112, a cooling supply system 109, a chemical supply system 110, a chemical delivery system 108 with an internally cooled multi-hole injector 114, and a process chamber 102. The chemical supply system 110 supplies one or more process chemicals 116, such as precursor gasses, to the delivery system 108. The delivery system 108 delivers the process chemicals 116 to a substrate 106 for a microelectronic workpiece positioned within the process chamber 102 using the internally cooled multi-hole injector 114. As described in more detail below, the injector 114 includes a channel and outlets that provide multiple holes for delivery of the process chemicals 116 to the substrate 106. The cooling supply system 109 supplies cooling chemicals 172 to the delivery system 108, and cooling delivery and return paths provide for the internal cooling of the process chemicals 116 within the injector 114. The injector 114 can be implemented using one or more of the injector embodiments described herein. Further, the substrate 106 (in one example a semiconductor wafer) can be held by a substrate holder 104, such as an electrostatic chuck. A heater can also be included within or associated with the substrate holder 104. Other variations can also be implemented while still taking advantage of the internal cooling techniques described herein.

The controller 112 is coupled to control operation of the components for the processing system 100 to achieve the functions described herein. For example, the controller 112 can control the cooling supply system 109, the chemical supply system 110, and the delivery system 108 to achieve a target cooling level for the process chemicals 116. The controller 112 can be implemented in a wide variety of manners. For example, the controller 112 may be a computer. In another example, the controller 112 includes one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g., memory storage devices, FLASH memory, DRAM memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

Figure 1B:
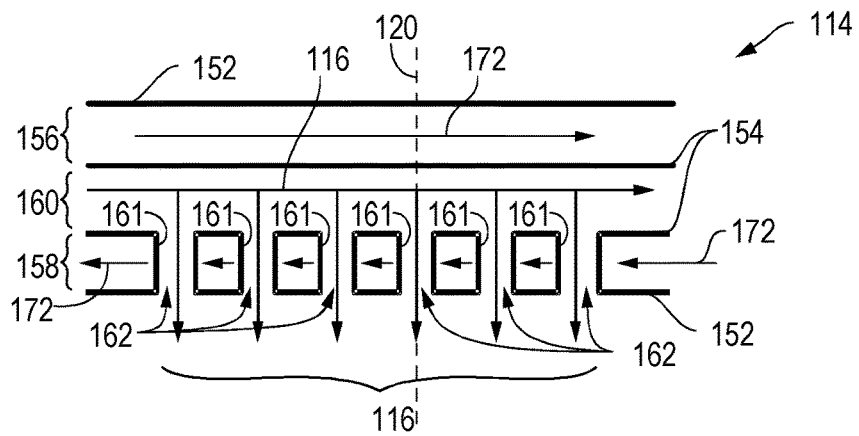
FIGS. 1B-1C are side view and cross-section view diagram of an example embodiment for an internally cooled multi-hole injector including an outer tube that surrounds an inner tube to provide a channel for process chemicals as well as cooling delivery and return paths for cooling chemicals.

FIG. 1B is a side view diagram of an example embodiment for the injector 114 in FIG. 1A where the injector 114 includes an outer tube 152 that surrounds an inner tube 154. The outer tube 152 defines a cooling delivery path 156 and a cooling return path 158 for cooling chemicals 172. Although not show, the cooling delivery path 156 and the cooling return path 158 can be connected together at one end of the injector 114. The inner tube 154 defines a channel 160 for the process chemicals 116 being delivered to the substrate 106 within the process chamber 102. The holes 162 formed by outlets 161 between the inner tube 154 and the outer tube 152 allow for delivery of the process chemicals 116 to the substrate 106 within the process chamber 102.

Figure 1C:
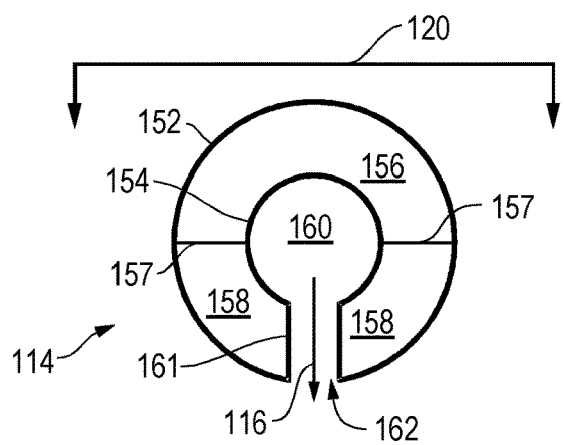

FIG. 1C is a cross-section diagram of an example embodiment for the injector 114 of FIG. 1B along dashed line 120. As described with respect to FIG. 1B, the inner tube 154 defines the channel 160 for the process chemicals 116 being delivered to the substrate 106 within the process chamber 102. The outer tube 152 defines the cooling delivery path 156 and the cooling return path 158 for the cooling chemical, such as a cooling gas or liquid. Baffles 157 are positioned between the outer tube 152 and the inner tube 154 to separate the cooling delivery path 156 and the cooling return path 158. As described above, the cooling delivery path 156 and the cooling return path 158 can be connected together at one end of the injector 114. As also described above, a hole 162 is formed by the outlet 161 between the inner tube 154 and the outer tube 152, and this hole 162 and the other holes shown in FIG. 1B allow for delivery of the process chemicals 116 to the substrate 106 within the process chamber 102.

In operation, the internally cooled channel 160 reduces undesired deposits and allows for increased reactant concentrations to be supplied and delivered through multiple holes 162 for the injector 114. The internally cooled channel 160 also helps to minimize depletion and reaction inside the injector 114 with respect to the process chemicals 116 being delivered to the substrate 106 within the process chamber 102. As such, intervals between process maintenance (PM) cycles can be extended thereby reducing overall cost of operating the delivery system 108 and related processing equipment. Further, the counter flow provided by the cooling return path 158 causes a more uniform thermal profile across the injector 114. For one example embodiment, the internally cooled multi-hole injector 114 can also be implemented in a high-temperature operating environment, such as within a process chamber environment having a temperature of 400° C. and above. Further, the high-temperature environment can be an isothermal high-temperature environment. Still further, the internally cooled multi-hole injector 114 allows for a compact design where the process chemicals 116 can be injected close to the substrate 106, which can have an elevated temperature within the process chamber 102. Other advantages can also be achieved.

It is noted that the process chemicals 116 can be one or more materials, including gasses or liquids, to be delivered to the substrate 106 within the process chamber 102. The cooling chemicals 172 can be one or more materials, including gasses or liquids, that are flowed through the cooling delivery path 156 and the cooling return path 158 to cool the process chemicals 116 within the channel 160 for the injector 114. Further, the processing can be controlled, for example by the controller 112 in FIG. 1A, to achieve a target cooling level for the process chemicals 116. Preferably, the cooling is achieved using pressurized inert gas for the cooling chemicals 172, such as nitrogen ($N_2$), argon (Ar), and/or other inert gas. For one embodiment, the process chemicals 116 include ozone ($O_3$), and the cooling chemicals 172 include nitrogen ($N_2$). As the cooling chemicals 172 will not be exposed to the wafer reactive environment within the process chamber 102, other non-inert gasses can also be used for the cooling chemicals 172. For example, clean dry air (CDA) or other less expensive gasses can be used to effectively cool the inner tube 154. For one embodiment, CDA with a flow rate of 140 pounds-per-square-inch (PSI) or higher is used to achieve a target cooling level for the process chemicals 116 flowing within the channel 160 formed by the inner tube 154. Other variations can also be implemented.

To facilitate cooling, a reflective material or highly polished metal can be used for the materials of the injector 114, such as the outer tube 152 and/or inner tube 154. For example, having the internal and/or external surfaces of the injector 114 be a high reflective material will help to limit radiant heat transfer where a process chamber uses a radiant heater. The internal cooling of the channel 160 within injector 114 is thereby improved. For example, a material or coating having a thermal emissivity of less than or equal to 0.5 can be used for the injector 114. For example, with the embodiment of FIGS. 1B-1C, the inner tube 154, the outer tube 152, or both could be made of this low-thermal-emissivity material or could be coated with this low-thermal-emissivity material. Other variations can also be implemented.

For one embodiment, the injector 114 is made by machining a thermally conductive material into a desired shape and structure. For example, a solid billet of aluminum (Al), stainless steel (SS), other metal, or other thermally conductive material can be used as the starting material. This solid billet is then machined, for example, using electrical discharge machining (EDM) and/or other machining techniques. Additional features can also be inserted or added to the resulting machined structure. For example, inlet and/or outlet extensions can be inserted or welded to the tubes formed within the machined structure. Threaded extensions can also be used, for example, where water lines or other liquid cooling chemicals are used.

Figure 2A:
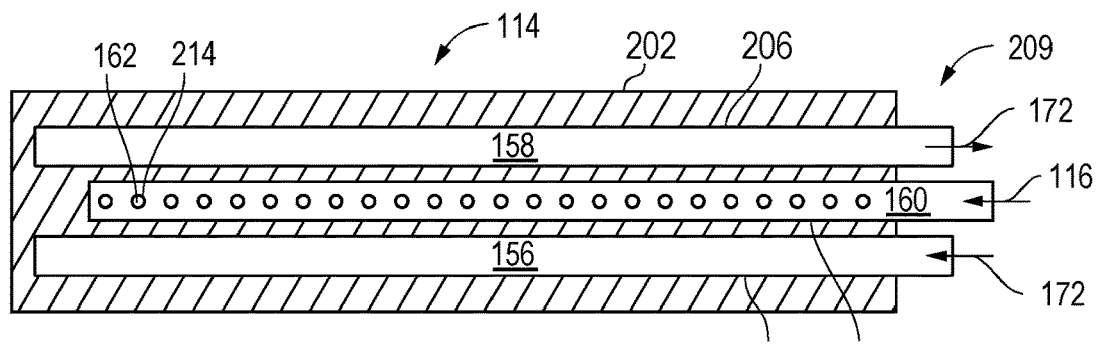
FIGS. 2A-2C are bottom view, side view, and cross-section view diagrams of an example embodiment for an internally cooled multi-hole injector including multiple tubes formed within an injector body to provide a channel for process chemicals as well as cooling delivery and return paths for cooling chemicals.
Figure 2B:
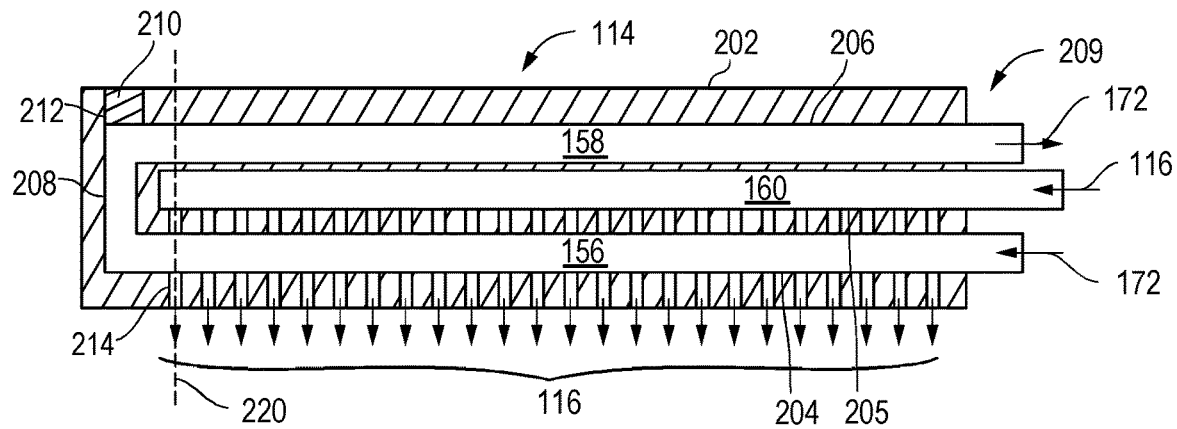

FIG. 2A is a bottom view of an example embodiment for an injector 114 including multiple tubes formed within an injector body 202 to provide the channel 160 for the process chemicals 116 as well as the cooling delivery path 156 and the cooling return path 158. The injector body 202 can be a metal material or other material that has good thermal transfer properties to achieve internal cooling of the channel 160. A center tube 205 provides the channel 160 for the process chemicals 116 that flow out holes 162 formed by outlets 214. One or more tubes 204 provide the cooling delivery path 156 for the cooling chemicals 172, and one or more tubes 206 provide the cooling return path 158 for the cooling chemicals 172. As shown in FIG. 2B, the tubes 204 and the tubes 206 can be connected together within the injector 114.

For one embodiment, the injector body 202 can be formed using a solid billet and one or more machining techniques as described above. Further, extensions 209 can be welded to the tubes 204, 205, and 206. Threaded connections or other types of extension connections can be used in addition to or instead of welding the extensions 209 to the injector body 202. Other variations could also be implemented. It is further noted that the embodiment of FIG. 2A will provide particularly good results, for example, where radiant heat within the process chamber 102 is provided from or associated with the substrate holder 104 in FIG. 1A.

FIG. 2B is side view of the example embodiment of FIG. 2A. As described above, the injector 114 includes multiple tubes formed within an injector body 202. One or more tubes 204 provide the cooling delivery path 156 for the cooling chemicals 172, and one or more tubes 206 provide the cooling return path 158 for the cooling chemicals 172. The tubes 204 and the tubes 206 are connected by an interconnect tube 208. The interconnect tube 208 can be formed as part of the tubes 204/206, can be an additional tube, or can be formed using other techniques. The center tube 205 provides the channel 160 for the process chemicals 116 that flow out holes 162 formed by outlets 214.

Where EDM is used to form the injector 114 from a solid billet, one or more plugs 210 can be used to seal one or more holes 212 that are left after EDM processing has been used to create channels within the solid billet. For example, a U-shaped channel (e.g., tubes 204, 206, and 208) can be created by three EDM operations (e.g., two horizontal and one vertical) within the billet for the injector 114. A plug 210 is used to seal any hole 212 used to create a vertical channel. Once the plug 210 is installed after manufacture within the hole 212 within the injector body 202, the expectation is that the plug 210 will not be removed thereafter.

Figure 2C:
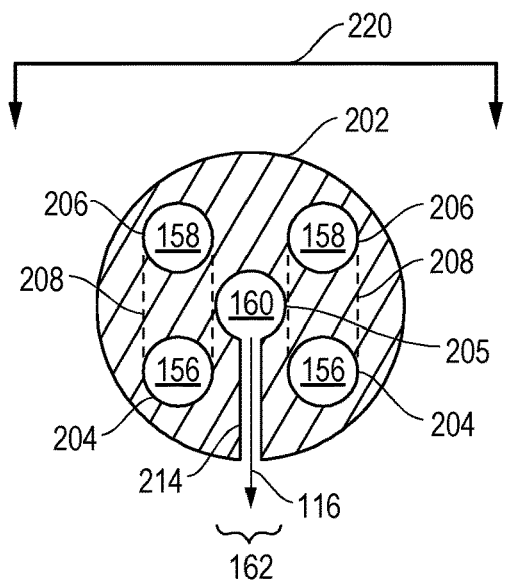

FIG. 2C is a cross-section diagram of an example embodiment for the injector 114 in FIG. 2B along dashed line 220. For this embodiment, the injector 114 includes two tubes 204 that provide the cooling delivery path 156, two tubes 206 that provide the cooling return path 158, and one tube 205 that provides the channel 160 for the process chemicals 116 that flow out hole 162 formed by outlets 214. The interconnect tubes 208 between tubes 204 and 206 are shown in dashed lines. For the embodiment depicted, the injector body 202 is cylindrical in shape although other shapes could be used while still taking advantage of the disclosed cooling techniques.

For one additional embodiment, the injector 114 is formed by coupling cooling tubes to a structure that includes the channel 160 for the process chemicals 116. For example, a solid billet of aluminum (Al), stainless steel (SS), other metal, or other thermally conductive material can be used as the starting material. This solid billet is than machined, for example, using electrical discharge machining (EDM) and/or other machining techniques to form a structure having a desired shape such as cylindrical shape, a box shape, and/or other desired shape. The cooling delivery/return tubes can then be coupled to or otherwise positioned adjacent this structure to provide internal cooling of the channel 160 within the injector 114.

FIG. 3 is a bottom view of an example embodiment for an injector 114 including cooling tubes 304 and 306 coupled adjacent to an injector body 302 having a channel 160 for the process chemicals 116. The injector body 302 as well as the tubes 304/306 can be a metal material or other material that has good thermal transfer properties to achieve internal cooling of the channel 160. The tube 304 provides the cooling delivery path 156 for the cooling chemicals 172, and the tube 306 provides the cooling return path 158 for the cooling chemicals 172. An interconnect tube 308 connects the tubes 304 and 306. The interconnect tube 308 can be formed as part of the tubes 304/306, can be a separate tube, or can be formed using other techniques. A center tube 205 formed within the injector body 302 provides the channel 160 for the process chemicals 116 that flow out holes 162 formed by outlets 314.

Looking further to FIG. 3, a cross-section view 350 is shown for the injector 114 along dashed line 320. The tube 304 provides the cooling delivery path 156, and the tube 306 provides the cooling return path 158. Tubes 304 and 306 are coupled adjacent to the injector body 302. For example, tubes 304 and 306 can be welded to the injector body 302 as indicated by weld joints 310. Other techniques could also be used. The tube 305 within injector body 302 provides the channel 160 for the process chemicals 116 that flow out hole 162 formed by outlets 314. For the embodiment depicted, the injector body 302 is box shaped although other shapes could be used while still taking advantage of the disclosed cooling techniques.

FIG. 4 is a side view of an example embodiment for an injector 114 including cooling tubes 404 and 406 that are coiled and interlaced around an injector body 402 having a channel 160 for the process chemicals 116. The injector body 402 as well as the tubes 404/406 can be a metal material or other material that has good thermal transfer properties to achieve internal cooling of the channel 160. The tube 404 provides the cooling delivery path 156 for the cooling chemicals 172, and the tube 406 provides the cooling return path 158 for the cooling chemicals 172. The tubes 404 and 406 are connected together at the end of injector body 402. Tubes 404/406 can be implemented as multiple tubes, as one single tube, and/or using other techniques. A center tube 405 formed within the injector body 402 provides the channel 160 for the process chemicals 116 that flow out holes 162 formed by outlets 414. For this embodiment, the injector body 402 can be cylindrical shape although other shapes could be used while still taking advantage of the disclosed cooling techniques.

Figure 5:
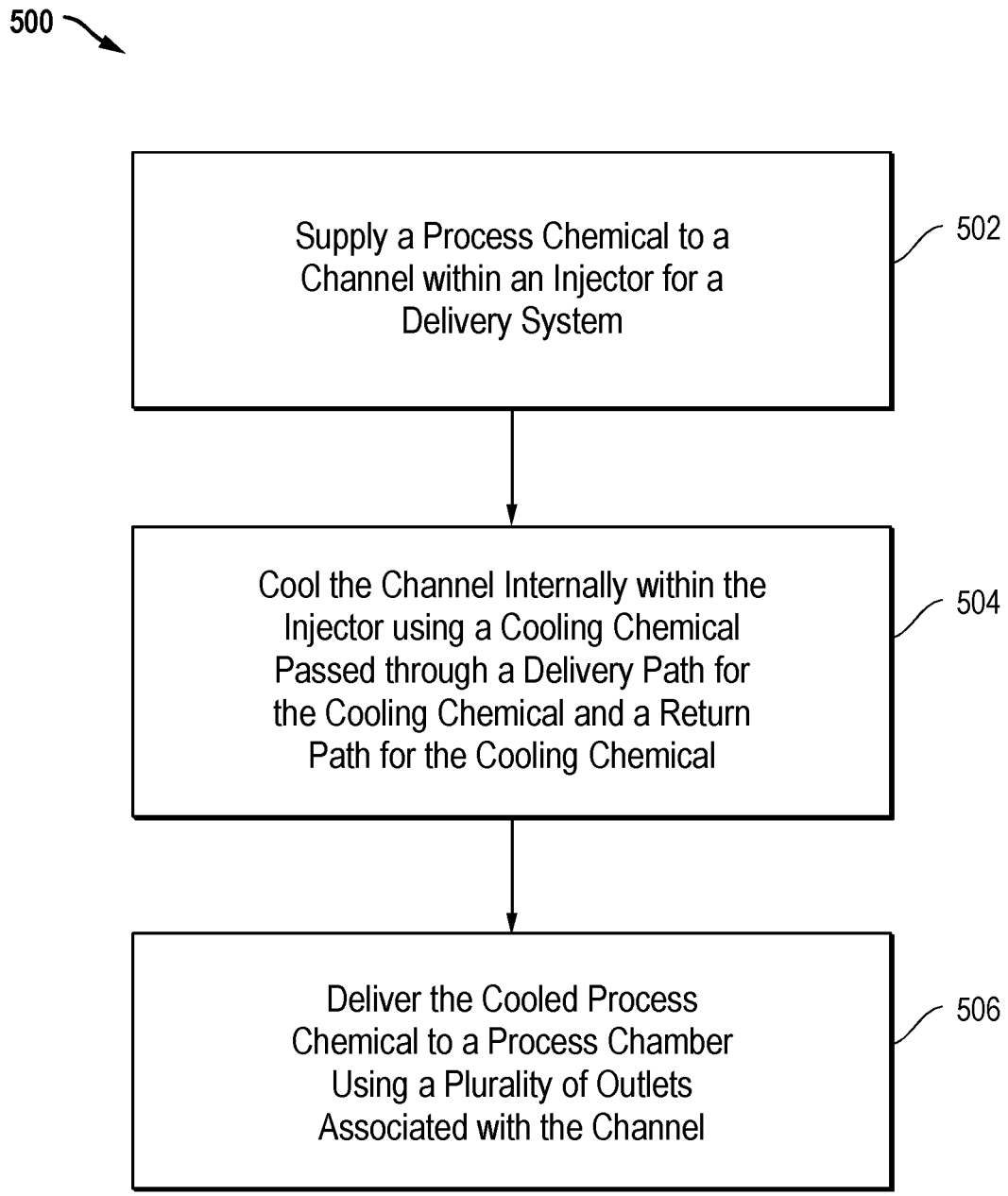
FIG. 5 is a process diagram of an example embodiment to deliver process chemicals to a process chamber using an internally cooled multi-hole injector.

FIG. 5 is a process diagram of an example embodiment 500 to deliver process chemicals 116 to a process chamber 102 using an internally cooled multi-hole injector 114. In block 502, one or more process chemicals 116 are supplied to a channel 160 within an injector 114 for a delivery system 108. In block 504, the channel 160 is cooled internally within the injector 114 using one or more cooling chemicals 172 passed through a delivery path 156 for the cooling chemicals 172 and a return path 158 for the cooling chemicals 172. In block 506, the cooled process chemicals 116 are delivered to a process chamber 102 using a plurality of outlets associated with the channel 160. It is noted that additional or different steps can also be performed while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. An injector to deliver process chemicals, comprising:
a channel for process chemicals;
a plurality of outlets associated with the channel to deliver the process chemicals to a process chamber;
a delivery path for cooling chemicals; and
a return path for the cooling chemicals;
wherein the delivery path and the return path are positioned with respect to the channel to cool the process chemicals internally within the injector.

2. The injector of claim 1, wherein the process chemicals comprise one or more gasses, and wherein the cooling chemicals comprise one or more inert gasses.

3. The injector of claim 1, wherein the channel is formed within an inner tube surrounded by an outer tube, and wherein the delivery path and the return path are formed within the outer tube.

4. The injector of claim 1, wherein the channel, the delivery path, and the return path are formed within an injector body.

5. The injector of claim 4, wherein the delivery path comprises one or more first tubes, wherein the return path comprises one or more second tubes, and wherein the first tubes are connected to the second tubes.

6. The injector of claim 5, further comprising one or more holes and one or more plugs sealing the holes, the holes being formed during manufacture of the injector.

7. The injector of claim 1, wherein the channel is formed within an injector body, and wherein the delivery path and the return path are formed by tubes coupled to the injector body.

8. The injector of claim 7, wherein the tubes for the delivery path and the return path are welded to the injector body or coiled around the injector body.

9. The injector of claim 7, wherein the injector body is at least one of a cylindrical shape or a box shape.

10. A processing system, comprising:
a process chamber;
a delivery system to deliver process chemicals to a process chamber;
an injector within the delivery system, comprising:
a channel for the process chemicals;
a plurality of outlets associated with the channel to deliver the process chemicals to the process chamber;
a delivery path for cooling chemicals; and
a return path for the cooling chemicals;
wherein the delivery path and the return path are positioned with respect to the channel to cool the process chemicals internally within the injector.

11. The processing system of claim 10, wherein the process chemicals comprise one or more gasses, and wherein the cooling chemicals comprise one or more inert gasses.

12. The processing system of claim 10, where the injector comprises one or more reflective materials to limit radiant heat transfer.

13. The processing system of claim 12, further comprising a substrate holder and a radiant heater associated with the substrate holder.

14. The processing system of claim 12, wherein the reflective material has a thermal emissivity of less than or equal to 0.5.

15. The processing system of claim 10, wherein the channel is formed within an inner tube surrounded by an outer tube, and wherein the delivery path and the return path are formed within the outer tube.

16. The processing system of claim 10, wherein the channel, the delivery path, and the return path are formed within an injector body.

17. The processing system of claim 10, wherein the channel is formed within an injector body, and wherein the delivery path and the return path are formed by tubes coupled to the injector body.

* * * * *